US007248112B2

(12) United States Patent
Itahara

(10) Patent No.: US 7,248,112 B2
(45) Date of Patent: Jul. 24, 2007

(54) HYBRID DISTORTION COMPENSATION METHOD AND HYBRID DISTORTION COMPENSATION DEVICE

(75) Inventor: Hiroshi Itahara, Yokohama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/485,141

(22) PCT Filed: Mar. 26, 2003

(86) PCT No.: PCT/JP03/03696

§ 371 (c)(1),
(2), (4) Date: Jan. 29, 2004

(87) PCT Pub. No.: WO03/096526

PCT Pub. Date: Nov. 20, 2003

(65) Prior Publication Data

US 2004/0232985 A1 Nov. 25, 2004

(30) Foreign Application Priority Data

May 14, 2002 (JP) .............................. 2002-139111

(51) Int. Cl.
*H03F 1/26* (2006.01)
(52) U.S. Cl. ...................................... 330/149; 330/151
(58) Field of Classification Search .................. 341/51, 341/52, 149, 150, 151, 152; 330/51, 149, 330/150, 151; 455/143.3, 126, 114.3; 375/296, 375/297
See application file for complete search history.

(56) References Cited

U.S. PATENT DOCUMENTS 5,489,875 A * 2/1996 Cavers ........................ 330/151
5,760,646 A * 6/1998 Belcher et al. ............. 330/149
5,870,668 A   2/1999 Takano et al.

(Continued)

FOREIGN PATENT DOCUMENTS

CN              1154023           7/1997

(Continued)

OTHER PUBLICATIONS

International Search Report dated Jul. 22, 2003.

(Continued)

*Primary Examiner*—Linh V. Nguyen
(74) *Attorney, Agent, or Firm*—Stevens, Davis, Miller & Mosher, LLP

(57) ABSTRACT

A hybrid distortion compensation method and apparatus that greatly improves the capability to compensate for non-linear distortion due to a high frequency power amplifier over a wideband in strict conditions of smaller size and reduced power consumption. An adaptive pre-distortion section (14) and a feed forward distortion compensation circuit (30) are connected via a D/A converter (20), an A/D converter (28) and the like, and signals of parts of the feed forward distortion compensation circuit (30) are taken out using a switch circuit (SW), fed back to a digital signal processing system, and processed using highly accurate digital signal processing in a control-monitoring section (60). After an adjustment section (51) makes characteristics of two input signals of the feed forward distortion compensation circuit (30) coincide, feed forward distortion compensation is performed. A sequencer (80) controls the components sequentially.

11 Claims, 13 Drawing Sheets

U.S. PATENT DOCUMENTS

| | | | |
|---|---|---|---|
| 5,877,653 A | 3/1999 | Kim et al. | |
| 5,949,283 A | 9/1999 | Proctor et al. | |
| 6,078,216 A | 6/2000 | Proctor, Jr. | |
| 6,118,339 A | 9/2000 | Gentzler et al. | |
| 6,246,286 B1 | 6/2001 | Persson | |
| 6,266,517 B1 | 7/2001 | Fitzpatrick et al. | |
| 6,275,105 B1* | 8/2001 | Ghannouchi et al. | 330/151 |
| 6,275,106 B1* | 8/2001 | Gomez | 330/151 |
| 6,342,810 B1* | 1/2002 | Wright et al. | 330/51 |
| 6,396,344 B1* | 5/2002 | Gentzler et al. | 330/149 |
| 6,504,428 B2* | 1/2003 | Cova et al. | 330/52 |
| 6,522,198 B2* | 2/2003 | Ahn | 330/149 |
| 6,711,217 B1* | 3/2004 | Jeong | 375/297 |
| 6,734,732 B2* | 5/2004 | Cavers | 330/149 |
| 6,774,716 B2* | 8/2004 | Suto | 330/52 |
| 6,947,711 B1* | 9/2005 | Leyonhjelm | 455/114.3 |
| 7,058,369 B1* | 6/2006 | Wright et al. | 455/114.2 |
| 2002/0012404 A1* | 1/2002 | Ahn | 375/297 |
| 2004/0242180 A1* | 12/2004 | Beach et al. | 455/323 |
| 2004/0251961 A1* | 12/2004 | Braithwaite | 330/52 |
| 2005/0068102 A1* | 3/2005 | Hongo et al. | 330/149 |

FOREIGN PATENT DOCUMENTS

| | | |
|---|---|---|
| EP | 1191685 | 3/2002 |
| EP | 1193862 | 4/2002 |
| JP | 964780 | 3/1997 |
| JP | 10190361 | 7/1998 |
| JP | 2000312116 | 11/2000 |
| JP | 200276785 | 3/2002 |
| JP | 2002100940 | 4/2002 |

OTHER PUBLICATIONS

3GPP TS25.104 V3.7.0 (Jun. 2001), 3rd Generation Partnership Project; Technical Specification Group Radio Access Networks; UTRA (BS) FDD; Radio transmission and Reception (Release 1999), pp. 1-41.

Chinese Office Action dated May 27, 2005 with English translation.

3GPP TS25.104 V3.7.0 (Jun. 2001) 3rd Generation Partnership Project; Technical Specification Group Radio Access Networks; UTRA (BS) FDD; Radio transmission and Reception (Release 1999), pp. 1-41, no month.

Supplementary European Search Report dated Apr. 6, 2006.

* cited by examiner

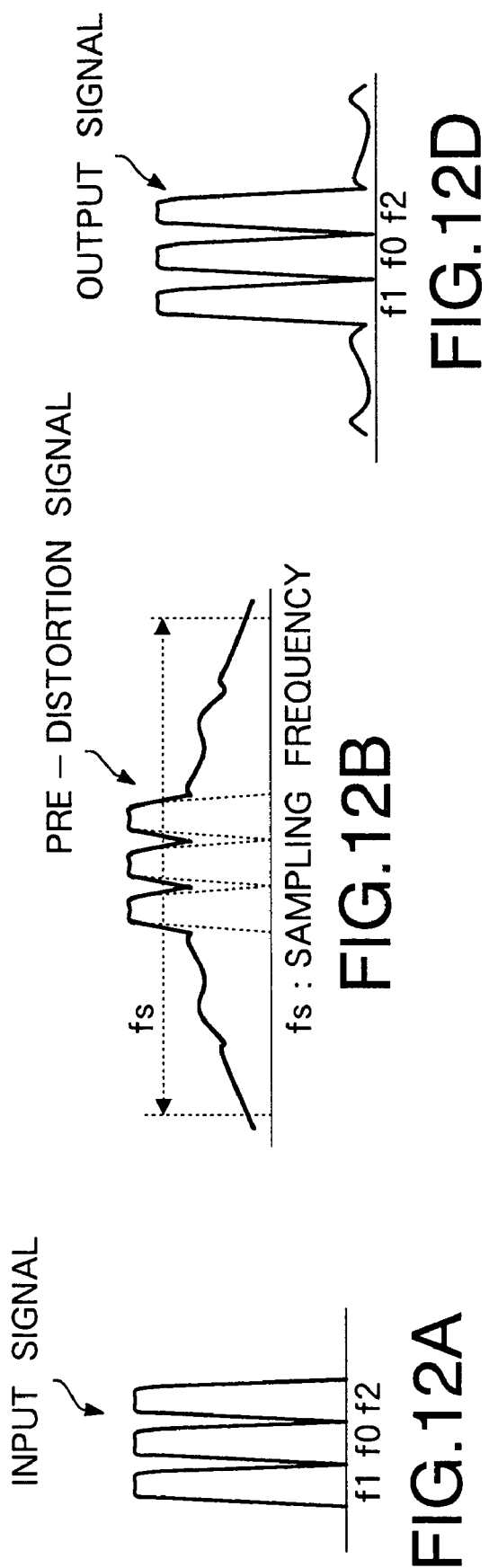

HYBRID DISTORTION COMPENSATION METHOD AND HYBRID DISTORTION COMPENSATION DEVICE

CROSS REFERENCES TO RELATED APPLICATION

This is a continue application of 371 of PCT/JP03/03696 filed on Mar. 26, 2003.

TECHNICAL FIELD

The present invention relates to a hybrid distortion compensation method and a hybrid distortion compensation apparatus using both distortion compensation of a scheme that performs pre-distortion processing on a digital signal and distortion compensation of a feed forward scheme.

BACKGROUND ART

In mobile communications of a CDMA scheme and digital terrestrial television broadcast scheduled to be implemented in the immediate future in Japan, a so-called multicarrier communication scheme is used wherein information is transmitted using a plurality of carriers distributed over a wideband.

Providing the same number of high frequency power amplifiers as the number of carriers in multicarrier transmission would be a great burden in terms of the size and cost of the apparatus.

Therefore, a multicarrier signal needs to be collectively amplified by one high frequency power amplifier.

When a high frequency signal of a wide band is amplified by one high frequency power amplifier, various distortions due to the non-linearity of the high frequency power amplifier (non-linear distortions: for example, a mutual modulation distortion) easily appear.

Methods for reducing non-linear distortions are mainly classified into a pre-distortion scheme and a feed forward scheme.

The pre-distortion scheme is a scheme in which a pseudo-distortion for canceling out distortion expected to occur in a power amplifier is preliminarily given to a signal to be input into the power amplifier.

The feed forward scheme is a scheme that extracts a distortion component contained in the output signal of a power amplifier, inverts the phase of the distortion component, and feeds back the inverted signal to the output signal of the power amplifier to cancel out the distortion component.

In recent years, a scheme has been proposed that combines these typical distortion compensation techniques. An analog distortion compensation circuit having an adaptive pre-distortion circuit and a feed forward power amplifier combined is disclosed in U.S. Pat. No. 5,760,646.

As can be seen from the circuit diagram of FIG. 1 of the above publication, the distortion compensation circuit disclosed in this U.S. Pat. No. 5,760,646 is configured such that a distortion component signal (an error signal fed back to a main path after inverted in phase) that appears in the feed forward loop of a typical feed forward power amplifier is also input into a pre-distortion function generator (a circuit generating a control signal for a pre-distortion characteristic) to control an analog pre-distortion circuit to perform adaptive pre-distortion processing.

The distortion compensation circuit disclosed in the above U.S. Pat. No. 5,760,646 detects distortion contained in the output signal of the power amplifier when being a high frequency analog signal (a RF analog signal), and performs RF pre-distortion processing (pre-distortion processing on the high frequency analog signal) based on the distortion component signal.

However, there is a limit to accuracy in detecting the distortion component signal (RF error signal) from the high frequency analog signal (limit due to processing of detecting the analog signal).

Also there is a limit to accuracy in pre-distortion processing using an analog circuit due to analog signal processing.

Therefore, the capability of this distortion compensation circuit to compensate for non-linear distortions is not so high.

Meanwhile, with respect to multicarrier transmission in mobile communications of the CDMA scheme and digital terrestrial television broadcast scheduled to be implemented in the immediate future in Japan, it is required to satisfy unprecedented strict standards in order to maintain high communication quality.

That is, it is required to compensate for distortion of the transmit signal having an extremely wide band with high accuracy and stably adapting to the environment.

The prior art technology cannot meet such strict requirements.

Moreover, in the mobile communications field, much smaller transceivers with reduced power consumption and cost to an extreme extent are required. This makes it further difficult to realize a great improvement of the capability to reduce non-linear distortions of a wideband.

DISCLOSURE OF INVENTION

An object of the present invention is to greatly improve the capability of a distortion compensation circuit to compensate for wideband non-linear distortion, satisfying the demand for smaller and simplified circuits with reduced power consumption and lowered cost.

A hybrid distortion compensation method according to the present invention uses both a scheme where pre-distortion processing (preferably adaptive pre-distortion processing) is performed on a digital signal and a feed forward scheme, and comprises the steps of performing distortion compensation according to the two schemes, and adjusting feed forward loop characteristics using digital control to enable highly accurate distortion compensation of the feed forward scheme.

Moreover, a hybrid distortion compensation apparatus according to the present invention is a novel distortion compensation apparatus of a full digital control scheme having a circuit configuration where a digital signal processing circuit and a high frequency power analog circuit are connected via a signal path including a D/A converter and an A/D converter.

According to an embodiment of the present invention, there is provided a hybrid distortion compensation apparatus which comprises an adaptive pre-distortion circuit that gives distortion of an opposite characteristic to a non-linear characteristic of a power amplifier to an input digital signal, and a feed forward distortion compensation circuit that, by a feed forward loop, compensates for a distortion component that the adaptive pre-distortion circuit cannot compensate for, wherein the feed forward distortion compensation circuit has two signal input ports so that two signals can be input separately, wherein a signal after adaptive pre-distortion processing by the adaptive pre-distortion circuit is input to one signal input port, and wherein a reference signal corresponding to the input digital signal before the adaptive pre-distortion processing by the adaptive pre-distortion circuit is input to the other signal input port.

According to another embodiment of the present invention, there is provided a hybrid distortion compensation method using both pre-distortion processing of a digital signal and distortion canceling processing of a feed forward scheme, wherein, after the pre-distortion processing and before the distortion canceling processing of the feed forward scheme, adjustment using digital sign processing is performed to make characteristics of two signals separately input into a circuit performing distortion canceling processing of the feed forward scheme coincide.

According to yet another embodiment of the present invention, there is provided a hybrid distortion compensation method using both pre-distortion processing of a digital signal and distortion canceling processing of a feed forward scheme and controlling digitally, including: a first step of performing pre-distortion processing on an input digital signal by a pre-distortion circuit, converting the pre-distortion processed digital signal into an analog signal, amplifying the converted analog signal by a power amplifier, converting the amplified signal into a digital signal, and adaptively controlling a pre-distortion characteristic of the pre-distortion circuit based on the converted digital signal; a second step of converting each of the output signal of the power amplifier input to a main path of a circuit that performs the distortion canceling processing of the feed forward scheme and a reference signal input to a feed forward loop into a digital signal, measuring characteristics of each of the converted signals by using digital signal processing, and adjusting at least one of gain, phase, and delay of the reference signal based on the measuring results such that the characteristics of the converted signals are the same; a third step converting a signal of the feed forward loop in the circuit that performs the distortion canceling processing of the feed forward scheme into a digital signal, detecting a correlation between the digital signal and the reference signal to measure the leakage amount of the reference signal contained in the signal of the feed forward loop, and determining the adjusting result of the second step based on the measuring result; and a fourth step of converting the output signal of the circuit that performs the distortion canceling processing of the feed forward scheme into a digital signal, and monitoring whether a predetermined characteristic of the converted digital signal is within a permissible range by using digital signal processing.

According to still another embodiment of the present invention, there is provided a hybrid distortion compensation apparatus which comprises a circuit performing pre-distortion processing on a digital signal and a circuit performing distortion canceling processing of a feed forward scheme, and which further comprises a control section provided with a digital signal processing circuit that, after the adaptive pre-distortion processing and before the distortion compensation by the feed forward loop, performs adjustment using digital signal processing to make characteristics of the two signals separately input into the feed forward distortion compensation circuit coincide;a monitoring section that monitors whether a characteristic of the output signal of the feed forward distortion compensation circuit is within a permissible range, using digital signal processing; and a sequencer that gives information for sequential control to the circuits, the control section, and the monitoring section.

According to yet another embodiment of the present invention, there is provided a hybrid distortion compensation apparatus of a digital control scheme which comprises a high frequency power amplifier; a pre-distortion section that gives an input digital signal an opposite characteristic to a non-linear characteristic of the high frequency power amplifier; a first signal path including a first D/A converter for transmitting the output signal of the pre-distortion section to the high frequency power amplifier; and a feed forward distortion compensation circuit that performs feed forward distortion compensation on the output signal of the high frequency power amplifier, and which comprises an adjuster that adjusts characteristics of the input digital signal not going through the pre-distortion section; a second signal path including a second D/A converter for transmitting the output signal of the adjuster as a reference signal of feed forward distortion compensation to the feed forward distortion compensation circuit; a switch circuit that selectively takes out one of the high frequency power amplifier's output signal given to the feed forward distortion compensation circuit, the reference signal given to the feed forward distortion compensation circuit via the second signal path, the signal of the feed forward distortion compensation circuit's feed forward loop, and the output signal of the feed forward distortion compensation circuit; a third signal path including an A/D converter for feeding back the signal output from the switch circuit to the pre-distortion section side; a control section that measures characteristics of each of the high frequency power amplifier's output signal and the reference signal, which are fed back via the third signal path, adjusts characteristics of the input digital signal by adaptively changing the adjuster's characteristics based on the measuring results such that characteristics of both the signals become the same, and after that, outputs a signal indicating adjustment completion; a monitoring section that measures a characteristic of the feed forward distortion compensation circuit's output signal fed back via the third signal path, determines whether the distortion compensation is good or not based on the measuring result, and outputs a signal indicating the determining result; and a sequencer that receives the signal indicating adjustment completion output from the control section and the signal indicating the determining result output from the monitoring section, switches the switch circuit based on the received signals, and gives a signal indicating the switching state of the switch circuit, as a signal for controlling sequentially operations of the components, to the control section and the monitoring section.

BRIEF DESCRIPTION OF THE DRAWINGS

FIG. 12A is a view showing the frequency spectrum of an input signal in the circuit of FIG. 11;

FIG. 12B is a view showing the frequency spectrum of a pre-distortion signal in the circuit of FIG. 11;

FIG. 12C is a view showing the frequency spectrum of a reference signal for feed forward distortion compensation in the circuit of FIG. 11; and FIG. 12D is a view showing the frequency spectrum of an output signal in the circuit of FIG. 11.

BEST MODE FOR CARRYING OUT THE INVENTION

Figure 1:
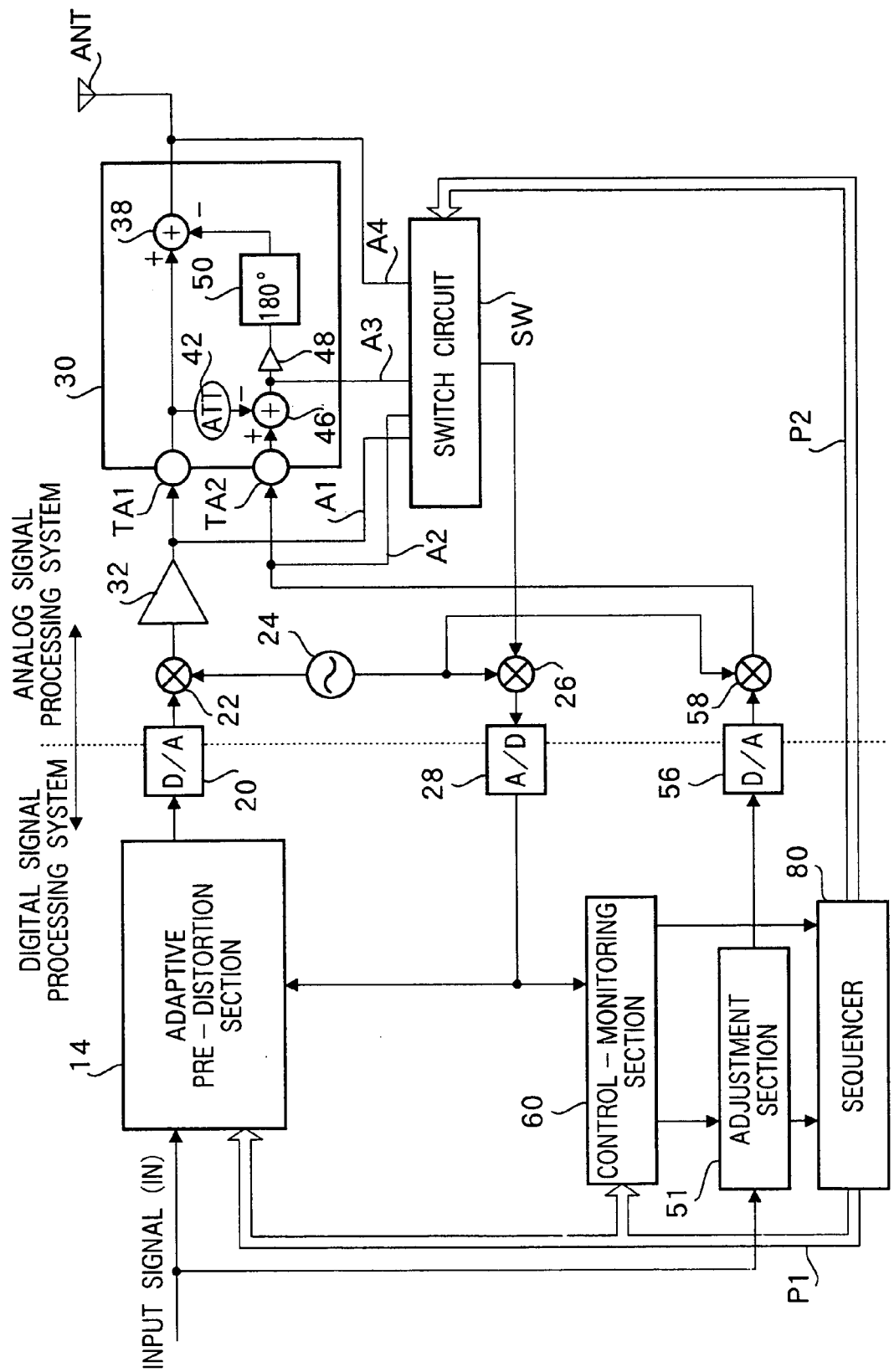
FIG. 1 is a circuit diagram showing the basic configuration of a distortion compensation circuit according to embodiment 1 of the present invention.

A preferred embodiment of a hybrid distortion compensation apparatus of the present invention obtains the following effects by performing the following processes (1) to (6).

(1) Adaptive pre-distortion processing is implemented as digital signal processing.

Since the pre-distortion is realized by the digital signal processing, more highly accurate processing is possible compared to analog pre-distortion.

(2) A high frequency analog signal is taken out of a feed forward distortion compensation circuit; the analog signal taken out is converted into a digital signal; a desired characteristic of the digital signal is measured with extremely high accuracy using sophisticated digital signal processing such as frequency spectrum analysis; and the measuring result is used as a base for the control and monitoring of the entire circuit.

That is, because the control and monitoring are performed based on incomparably more highly accurate data than analog signal processing, the adaptive pre-distortion processing and feed forward distortion compensation processing functions each improve greatly, so that distortion compensation capability improves greatly.

(3) Distortion compensation processing is divided into a plurality of stages, and the stages are each sequentially controlled.

Although the communication environment changes with time, it can be considered that the signal's characteristics do not change in a short period of time. In view of this point, by executing the plurality of stages sequentially according to a predetermined procedure, the distortion compensation processing can be performed naturally under digital control.

(4) The plurality of stages includes a first stage that performs the adaptive pre-distortion processing; a second stage that adjusts characteristics such as the amplitudes, phases, and delay amounts of two signals to be independently input into the feed forward distortion compensation circuit so as to match, which signals are an input signal to a main path containing non-linear distortion and a reference signal without non-linear distortion (a signal input to a feed forward loop); a third stage that confirms the adjusting results of the second stage; and a fourth stage that monitors the characteristics of the signal after the feed forward distortion compensation.

Because the characteristics of two independent input signals to the feed forward distortion compensation circuit are certainly adjusted to match precisely, adverse effects on the feed forward distortion compensation due to the presence of the pre-distortion circuit at the preceding stage can be prevented. Therefore, the respective accuracies in the adaptive pre-distortion and the feed forward distortion compensation are secured, and the distortion compensation capability can be greatly improved due to the synergy of the both processes.

That is, the adaptive pre-distortion distortion compensation circuit digitally controlled cannot remove low levels of high order IM distortion components (mutual modulation distortion components) spreading outside a sampling frequency band of A/D and D/A converters.

However, if they are within the sampling frequency band, low order distortion components of a power amplifier, which are high levels of distortion components, can be removed with high stability. Then, by effectively removing low levels of residual, high order IM distortion components by highly accurate feed forward distortion compensation processing, stable and highly accurate distortion compensation for the signal of a wideband can be realized.

Furthermore, because distortions are accurately suppressed, the gain of an error amplifier provided in the feed forward loop of the feed forward distortion compensation circuit can be lowered, thereby helping reduce power consumption.

(5) When the adjustment of the entire distortion compensation circuit through the first to third stages is completed, a monitoring stage (fourth stage) is taken, but as long as distortion is suppressed to within a predetermined range, the adaptive adjustment of a pre-distortion characteristic and the adjustment of characteristics of the input signal to the feed forward distortion compensation circuit are not performed, so that characteristics of each circuit are fixed in this period. Therefore, different from an analog circuit performing adaptive control all the time, power consumption can be reduced by this point as well.

(6) Moreover, because digital signal processing functions (such as correlation detection and power measurement) usually provided for recent mobile communication apparatuses can be used, it is relatively easy to implement the distortion compensation method of the present invention, which is high in practical value.

Embodiments of the present invention will be described with reference to the drawings.

(Embodiment 1)

In recent multicarrier communications of a W-CDMA scheme, higher linearity has been required of high frequency power amplifiers compared to mobile communications of other schemes. Hence, without compensating for the linearity deviation of the power amplifiers by using a distortion compensation technology such as adaptive pre-distortion, power efficiency severely deteriorates.

For example, an input signal to the power amplifier has a bandwidth of 15 to 20 MHz. Hence, the band of a distortion component spreads from 100 to 200 MHz.

To compensate for this distortion component through adaptive pre-distortion alone, a digital signal having pre-distortion processing performed thereon needs to be D/A-converted at a sampling frequency of about 100 to 200 MHz, which is at least the same as the band of the distortion component.

Furthermore, to perform adaptive pre-distortion processing, an output signal of the power amplifier needs to be fed back to the digital signal processing system, and thus needs to be D/A-converted at a sampling frequency of about 100 to 200 MHz, which is at least the same as the band of the distortion component, likewise.

Moreover, according to the standard of the W-CDMA scheme, a resolution of as many as 12 to 16 bits is required of D/A and A/D converters.

Given the present semiconductor technology, it is very difficult to produce D/A and A/D converters that operate at 100 to 200 MHz while securing the high resolution of 12 to 16 bits.

Furthermore, even if such D/A and A/D converters could be produced, the amount of power consumption during the operation would be enormous, which contradicts with the distortion compensation for improving power efficiency.

Therefore, in the present embodiment, the band of a baseband input signal to have adaptive pre-distortion processing performed thereon is limited to frequency at which D/A and A/D converters can achieve resolution of 12 to 16 bits.

And high order distortion occurring in a higher frequency band than that is effectively removed by a feed forward distortion compensation circuit having its characteristics adjusted more precisely by digital signal processing.

Thus, extremely accurate distortion compensation, which has been impossible before, is possible using the existing LSI technology.

The features, configuration, and operation of a distortion compensation circuit of embodiment 1 will be described below with reference to FIGS. 1 to 7.

FIG. 1 is a circuit diagram showing the basic configuration of a hybrid distortion compensation apparatus according to the embodiment 1 of the present invention.

As illustrated, the hybrid distortion compensation apparatus comprises, as main components, an adaptive pre-distortion section (digital signal processing section) 14; a high frequency power amplifier 32; a feed forward distortion compensation circuit (high frequency power analog circuit) 30 having two input ports TA1, TA2; a high frequency switch circuit (hereinafter, simply called a switch circuit) SW for selectively taking out one of the two input signals and output signal of the feed forward distortion compensation circuit 30 and a signal of a feed forward loop; a control-monitoring section 60 belonging to the digital signal processing system; a adjustment section 51 for adjusting the amplitude (gain), phase, and delay of a reference signal given to the input port TA2 of the feed forward distortion compensation circuit 30 (an input signal (IN) to the hybrid distortion compensation circuit itself); and a sequencer 80 that controls switching the switch circuit SW while giving information (P1, P2) necessary to make the sections sequentially operate to the sections.

Furthermore, D/A converters 20, 56, an A/D converter 28, and a frequency converting circuit (having a RF carrier oscillator 24 and mixers 22, 26, 58) are provided in the signal path for sending and receiving signals between the digital signal processing system and the analog signal processing system.

The feed forward distortion compensation circuit 30, as illustrated, has the input port TA1 for inputting a signal containing a distortion component (residual non-linear distortion component that cannot be removed by the pre-distortion distortion compensation) into a main path and the input port TA2 for inputting a reference signal without distortion into a feed forward loop. Note that the main path is a path joining the input port TA1 and a coupler 38.

Furthermore, the feed forward loop is provided with an attenuator 42 for adjusting a signal amplitude, a coupler 46 for separating a distortion component from the signal in the main path, an error amplifier 48 for amplifying the distortion component signal, a phase sifter 50 for inverting the phase of the output signal of the error amplifier 48, and a coupler 38 for feeding back the output signal of the phase sifter 50 to the main path.

The hybrid distortion compensation apparatus has a hybrid configuration where the adaptive pre-distortion section 14, which performs adaptive pre-distortion on a base band digital signal, and the feed forward distortion compensation circuit are integrated.

Note that it is impossible to simply combine these.

Hence, for the circuit of FIG. 1, a new configuration is adopted where the two input ports TA1, TA2 are provided for the feed forward distortion compensation circuit 30, and the output signal of the high frequency power amplifier 32 (signal containing a residual linear distortion component that cannot be removed by the pre-distortion distortion compensation) and the reference signal with no distortion are input into them respectively and independently, thereby enabling integration of the distortion compensation circuits of different types.

The distortion compensation processing according to the hybrid distortion compensation method is mainly divided into two processes.

That is, high levels of distortion components within the sampling frequency band of the D/A converters 20, 56 and A/D converter 28, that is, low order distortion components of the high frequency power amplifier, are removed with high stability by adaptive pre-distortion distortion compensation of full digital control.

Then, low levels of residual, high order IM distortion components (mutual modulation distortion components outside the sampling frequency band) are removed by feed forward distortion compensation processing, thereby realizing unprecedented, highly accurate, wideband distortion compensation.

Here, if the accuracy in the feed forward distortion compensation using the analog circuit is not high, low levels of high order IM distortion components, which cannot be removed by the adaptive pre-distortion distortion compensation, will not be removed sufficiently, and thus the great improvement in the accuracy in removing distortion that the present invention is aiming at cannot be achieved.

Highly accurate distortion removal in the feed forward distortion compensation circuit 30 is realized on the premise that the input levels (amplitudes), phases, and delays of the two signals input to the two input ports TA1, TA2 completely coincide.

Hence, the distortion compensation circuit (hybrid distortion compensation circuit) of FIG. 1 is provided with an adjustment mechanism for adjusting the amplitudes and the like of the two signals input to the feed forward distortion compensation circuit 30 to completely coincide, which is an extremely important feature of the distortion compensation circuit of the present invention.

In other words, focusing on a feedback path (a signal path for returning the signal after the feed forward distortion compensation processing to the adaptive pre-distortion section 14) being a must in the adaptive pre-distortion processing, the distortion compensation circuit of FIG. 1 has the two signals (A1, A2 in FIG. 1) input to the feed forward distortion compensation circuit 30 and the feed forward loop's signal (A3 in FIG. 1) returned to the digital signal processing system by using the feedback path.

And the control-monitoring section 60 accurately measures the differences in the amplitude (gain), initial phase, and transmission delay (difference in at least one of the characteristics) between the two input signals of the feed forward distortion compensation circuit 30 by using highly accurate digital signal processing.

Next, the adjustment section 51 for the amplitude and the like adjusts at least one (preferably all the characteristics) of the amplitude, phase, and delay of the reference signal (the input signal (IN) to the distortion compensation circuit) such that the measured differences become zero.

By this means, the characteristics such as the amplitudes (gains), initial phases, and transmission delays of the two input signals to the feed forward distortion compensation circuit 30 completely coincide, so that conditions for highly accurate feed forward distortion compensation are in place.

Moreover, the output signal of the high frequency power amplifier 32 input into the feed forward distortion compensation circuit 30 is a signal having high level of distortion removed by the pre-distortion distortion compensation.

Therefore, a high level of a distortion component is not input into the error amplifier 48 present in the feed forward loop. Thus, the power amplifying rate of the error amplifier can be set low, which helps reducing power consumption.

After the pre-distortion processing and the adjustment of the characteristics of the two input signals to the feed forward distortion compensation circuit 30 are completed, the switch circuit SW outputs the output signal (signal A4 in FIG. 1) of the feed forward distortion compensation circuit 30 to be fed back to the digital signal processing system.

Then, when desired distortion compensation accuracy is not secured, the control-monitoring section 60 monitors the characteristics of this feedback signal, and the pre-distortion processing and the adjustment of the characteristics of the two input signals to the feed forward distortion compensation circuit 30 are sequentially performed again.

The sequence of signal processing is controlled by the sequencer 80.

The main processing stages of the distortion compensation processing of the present embodiment and the circuit operation in each stage will be described below with reference to FIG'S. 2 to 5.

(Adaptive Pre-Distortion Processing Stage)

Figure 2:
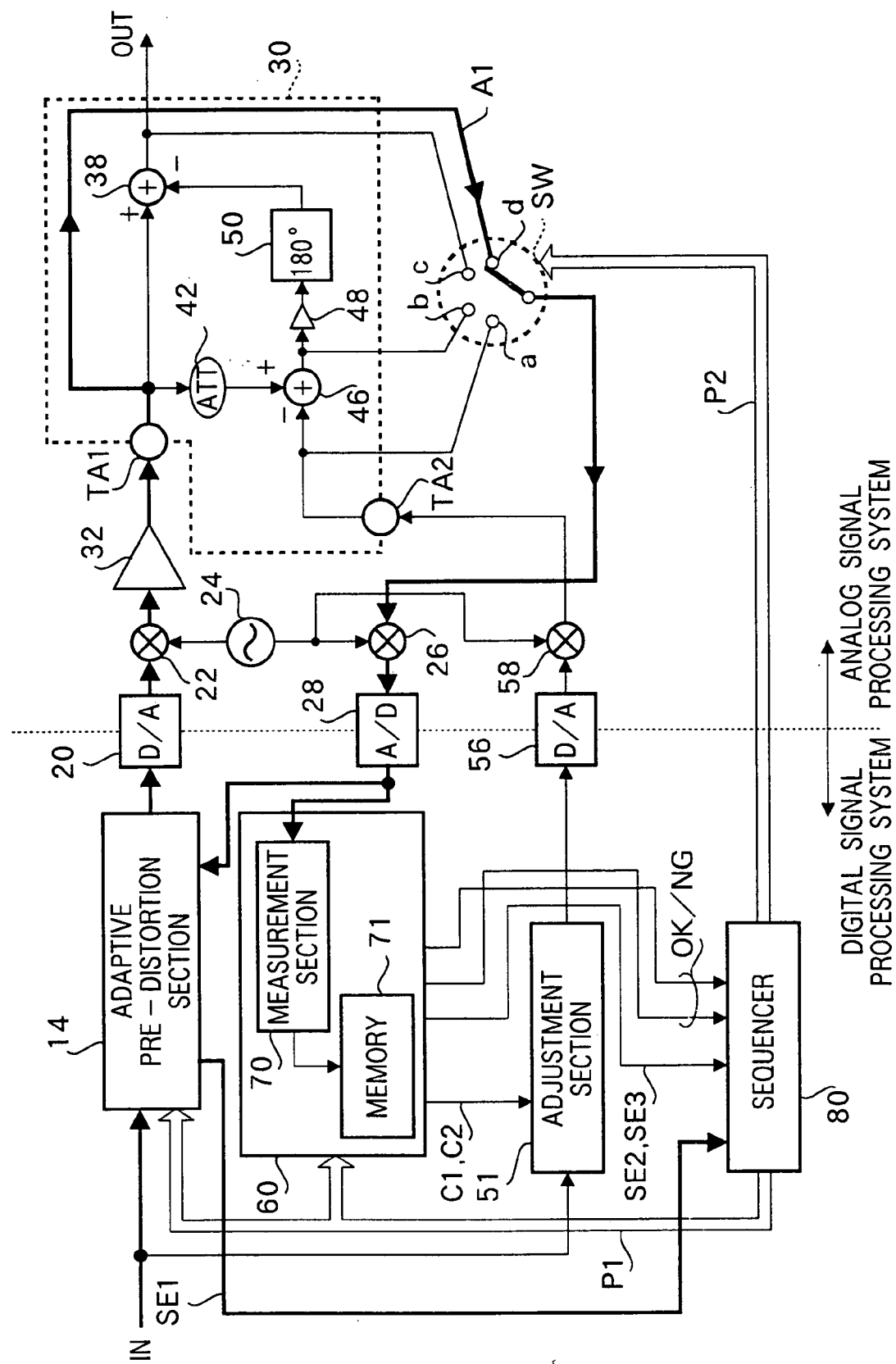
FIG. 2 is a view for explaining characteristic operation (signal current) of the distortion compensation circuit of FIG. 1 in an adaptive pre-distortion processing stage.

FIG. 2 is a view for explaining the circuit operation in an adaptive pre-distortion processing stage. In this figure, a characteristic operation in this stage is indicated by thick arrows (as in FIG'S. 3 to 5 used in later explanations).

The switch circuit (SW) is switched to a d-port side by a control signal (P2) from the sequencer 80.

The sequencer 80 gives the adaptive pre-distortion section 14 and the control-monitoring section 60 a signal indicating the state of the switch circuit (SW) (a switch state signal P1).

The adaptive pre-distortion section 14 recognizes that the current stage is the adaptive pre-distortion processing stage from the switch circuit (SW) is switched to the d-port side.

The circuit operation will be described below with tracking signal transmission paths indicated by the thick arrows in FIG. 1.

After being pre-distortion processed in the adaptive pre-distortion section 14, the input signal (a signal to be transmitted by radio) IN is converted into a digital signal in the D/A converter 20 and up-converted in the frequency converting circuit (22, 24), and then amplified in the high frequency power amplifier 32 to be input into the input port TA1 of the feed forward distortion compensation circuit 30.

This input signal has a distortion component superimposed thereon, which has not been removed by the pre-distortion distortion compensation.

The switch circuit (SW) is switched to the d-port side by the control of the sequencer 80. A signal (A1) to be input into the input port TA1 of the feed forward distortion compensation circuit 30 is selectively output from the switch (SW).

This signal A1 is returned to the digital signal processing system via a frequency converter (26, 24) and the A/D converter 28.

Based on this returned signal (i.e. feedback signal), the adaptive pre-distortion section 14 adaptively updates the pre-distortion characteristic, the method of which will be specifically described later with reference to FIG. 8A and FIG. 8B.

This feedback signal is also given to the control-monitoring section 60. A measuring section 70 of the control-monitoring section 60 measures the characteristics such as the signal level (amplitude and gain), phase, and delay of the feedback signal, and temporarily stores the measuring results in a memory 71.

After adaptive control (updating control parameters for the pre-distortion) is completed, the adaptive pre-distortion section 14 sends a stage end signal (SE1) notifying the end of the adaptive pre-distortion processing stage to the sequencer 80.

(Stage of Matching the Characteristics of the Two Input Signals of the Feed Forward Distortion Compensation Circuit)

Figure 3:
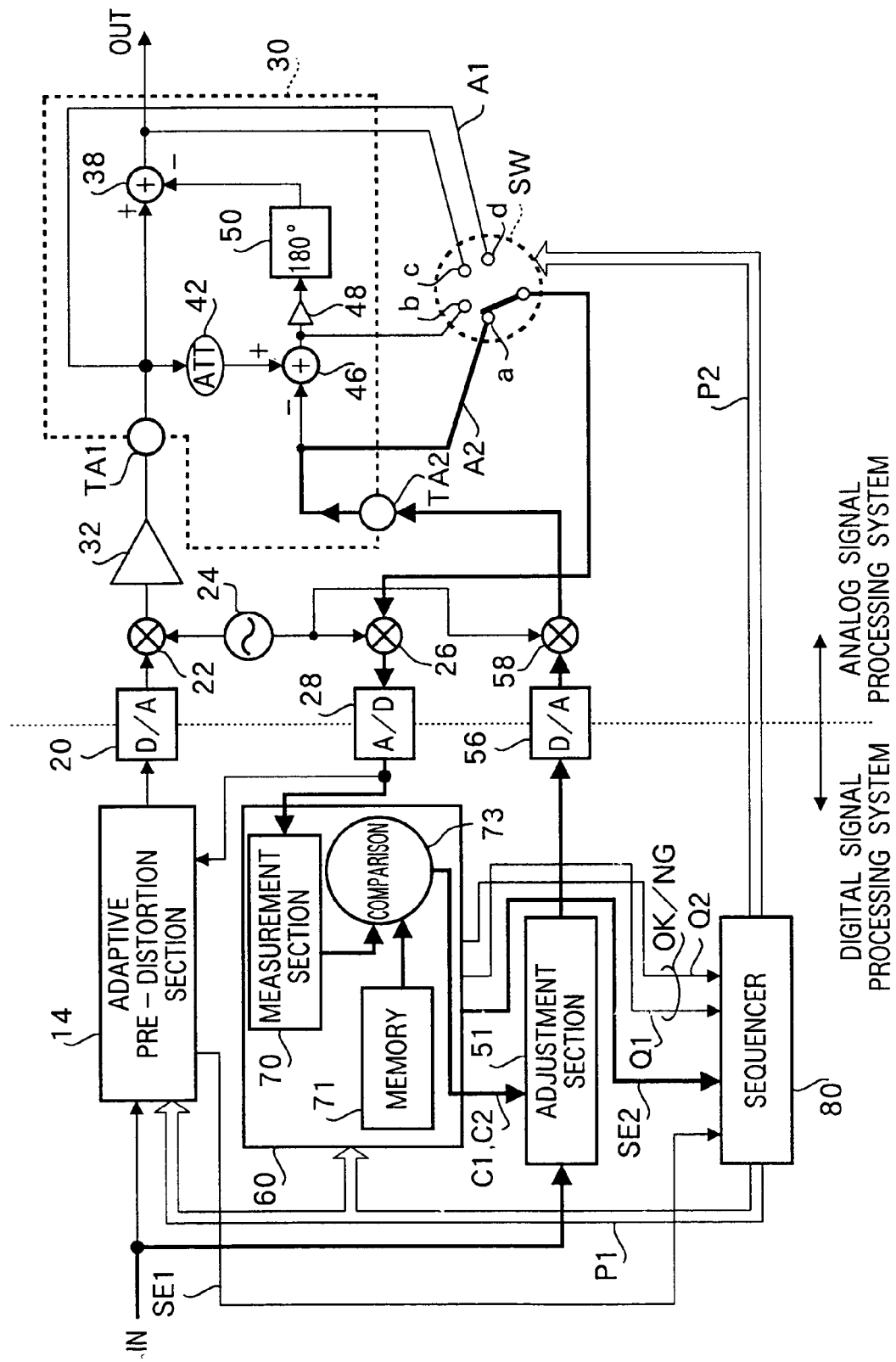
FIG. 3 is a view for explaining characteristic operation (signal current) of the distortion compensation circuit of FIG. 1 in a stage of adjusting to match characteristics of the two input signals of a feed forward distortion compensation circuit.

FIG. 3 is a view for explaining the circuit operation in a stage of adjusting the characteristics of the two signals.

In this stage, the switch circuit (SW) is switched to an a-port side by the control signal (P2) from the sequencer 80.

Furthermore, the sequencer 80 gives the adaptive pre-distortion section 14 and the control-monitoring section 60 the signal indicating the state of the switch circuit (SW) (the switch state signal P1).

The control-monitoring section 60 recognizes that the current stage is the stage of matching the characteristics of the two input signals of the feed forward distortion compensation circuit, from the switch circuit (SW) being switched to the a-port side.

The input signal (IN) goes through the adjustment section 51, is converted into an analog signal in the D/A converter 56, and then up-converted in a frequency converting circuit (26, 58).

The up-converted signal is input as the reference signal into the input port TA2 of the feed forward distortion compensation circuit 30. The reference signal (A2) is selectively taken out from the switch circuit SW, and is returned to the digital signal processing system via the frequency converter (26, 24) and the A/D converter 28.

The measuring section 70 of the control-monitoring section 60 measures the characteristics such as the signal level (amplitude and gain), phase, and delay of the returned signal (feedback signal).

Next, a comparison section 73 compares the measuring results with the measuring results of the preceding stage temporarily stored in the memory 71 to obtain the differences.

Then, the adjustment section 51 adjusts the level, phase, and delay of the input signal (IN) such that the differences become zero.

If the adjustment has been accurately performed, the characteristics of the reference signal given to the input port TA2 of the feed forward distortion compensation circuit 30 will almost completely coincide with the characteristics of the output signal of the high frequency power amplifier 32.

After this fine adjustment is completed, the control-monitoring section 60 sends the sequencer 80 a stage end signal (SE2) indicating the end of the stage of matching the characteristics of the two input signals of the feed forward distortion compensation circuit.

(Stage of Confirming Effects of the Characteristics Adjustment)

In the preceding stage, the adjustment section 51 adjusted the level, phase, and delay of the input signal (IN) in order to match the characteristics of the two input signals of the feed forward distortion compensation circuit.

However, it is not certain that the characteristics of the two input signals actually coincide as a result of the adjustment, and there is a risk with proceeding to a final stage, a monitoring stage, without confirming this. Therefore, this stage confirms the effect of the adjustment.

Figure 4:
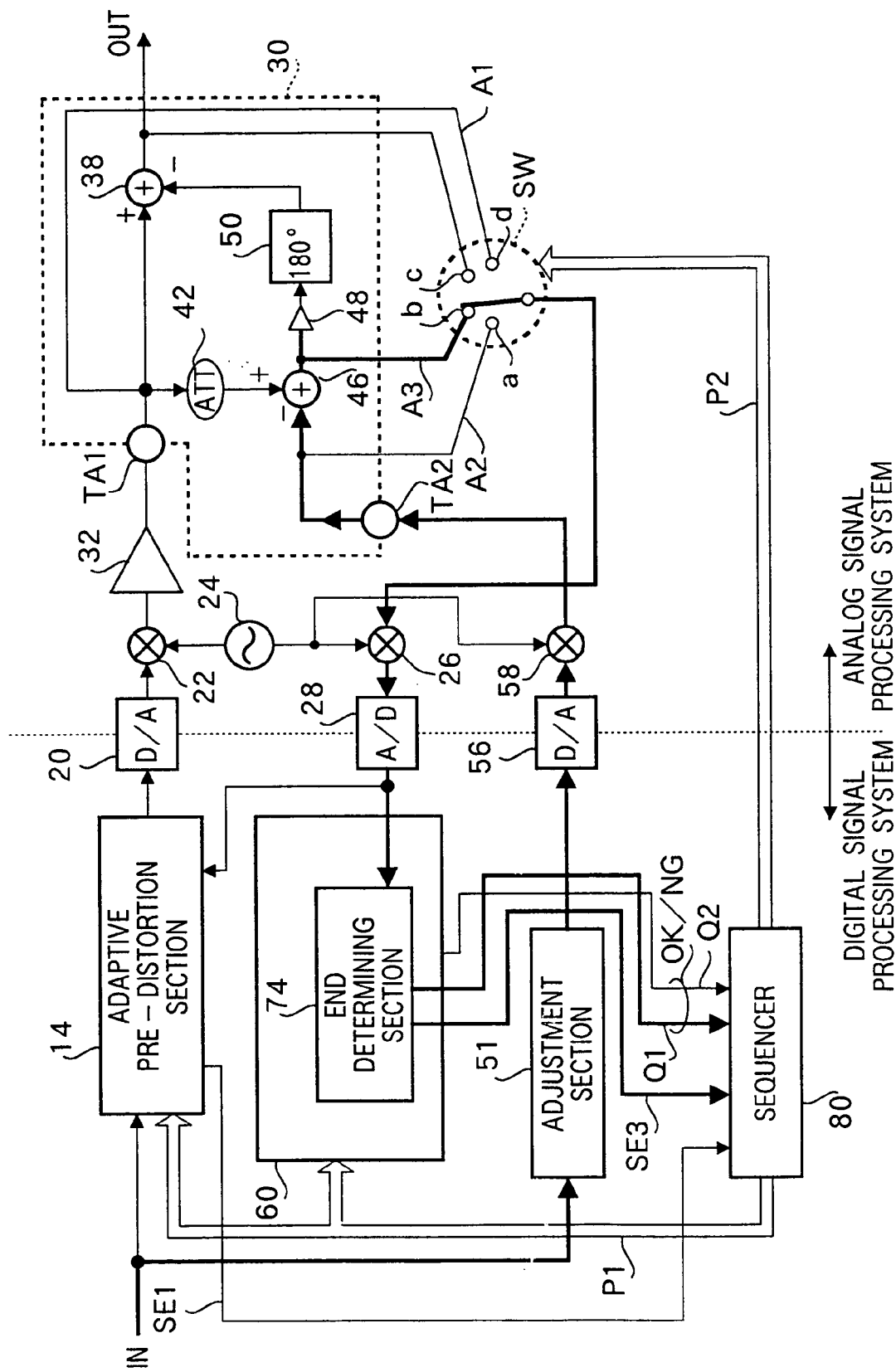
FIG. 4 is a view for explaining characteristic operation (signal current) of the distortion compensation circuit of FIG. 1 in a stage of confirming the adjusting result of FIG. 3.

FIG. 4 is a view for explaining the stage of confirming the results of adjusting the characteristics of the two signals to match.

In the present stage, the switch circuit (SW) is switched to a b-port side by the control signal (P2) from the sequencer 80. Furthermore, the sequencer 80 gives the adaptive pre-distortion section 14 and the control-monitoring section 60 the signal indicating the state of the switch circuit (SW) (the switch state signal P1).

The control-monitoring section 60 recognizes that the current stage is the stage of confirming whether the characteristics of the two input signals of the feed forward distortion compensation circuit actually coincide, from the switch circuit (SW) being switched to the b-port side.

If the characteristics of the two input signals of the feed forward distortion compensation circuit actually coincide, only the distortion component signal will be obtained in the feed forward loop. That is, a signal obtained by subtracting the reference signal from the main path's signal (signal being equivalent to the reference signal and containing non-linear distortion) in the coupler 46 will contain only the distortion component without the reference signal leaking thereinto.

And the level of the distortion component will be sufficiently suppressed by the effect of the adaptive pre-distortion distortion compensation.

Therefore, the value of the correlation between the signal obtained by subtracting the reference signal from the main path's signal in the coupler 46 and the reference signal is obtained, and the correlation value's power is calculated. If the power value is above a threshold value, the output signal of the coupler 46 of the feed forward distortion compensation circuit 30 must have the reference signal component leaking thereinto to a degree beyond a permissible value (that is, a substantial amount of the reference signal component that havs not been removed by the subtraction is contained therein).

In other words, due to an error in the adjustment of the two signals in the preceding stage, the reference signal leak component beyond a permissible value is contained as well as the distortion component.

Unless affirmative checking result is obtained in the present stage, the sequencer 80 repeatedly executes the preceding adjustment stage for matching the characteristics of the two input signals any number of times.

The characteristic operation in the present stage indicated by the thick arrows in FIG. 4 is almost the same as the operation shown in FIG. 3.

That is, a signal (distortion component signal A3) obtained by subtracting the reference signal from the main path's signal in the coupler 46 of the feed forward distortion compensation circuit 30 is selectively output from the switch circuit SW and fed back to the digital signal processing system.

Then an end determination section 74 of the control-monitoring section 60 obtains the value of the correlation between the feedback signal and the reference signal, calculates the power of the correlation value, and determines whether or not the amount of the reference signal leak component is within a permissible range by checking whether the power value is above a predetermined threshold value.

After the completion of the check, the control-monitoring section 60 sends a signal Q1 indicating the checking result (OK/NG) to the sequencer 80 and, in parallel therewith, sends a stage end signal (SE3) indicating the end of the present stage to the sequencer 80.

The sequencer 80 confirms whether the signal Q1 sent from the control-monitoring section 60 as the checking result indicates OK or NG, and upon OK, the switch circuit (SW) is switched to a c-port side so that a monitoring stage that is a final stage is taken.

On the other hand, upon NG, the switch circuit (SW) is not switched, and the adjustment stage of FIG. 3 is executed again. Subsequently, the check of FIG. 4 is executed again.

The reason for this extremely careful adjustment is that the analog feed forward distortion compensation plays an important role to effectively remove a minute level of high order distortion that the digital distortion compensation cannot remove due to the sampling frequency of D/A and A/D conversion.

(Monitoring Stage)

Figure 5:
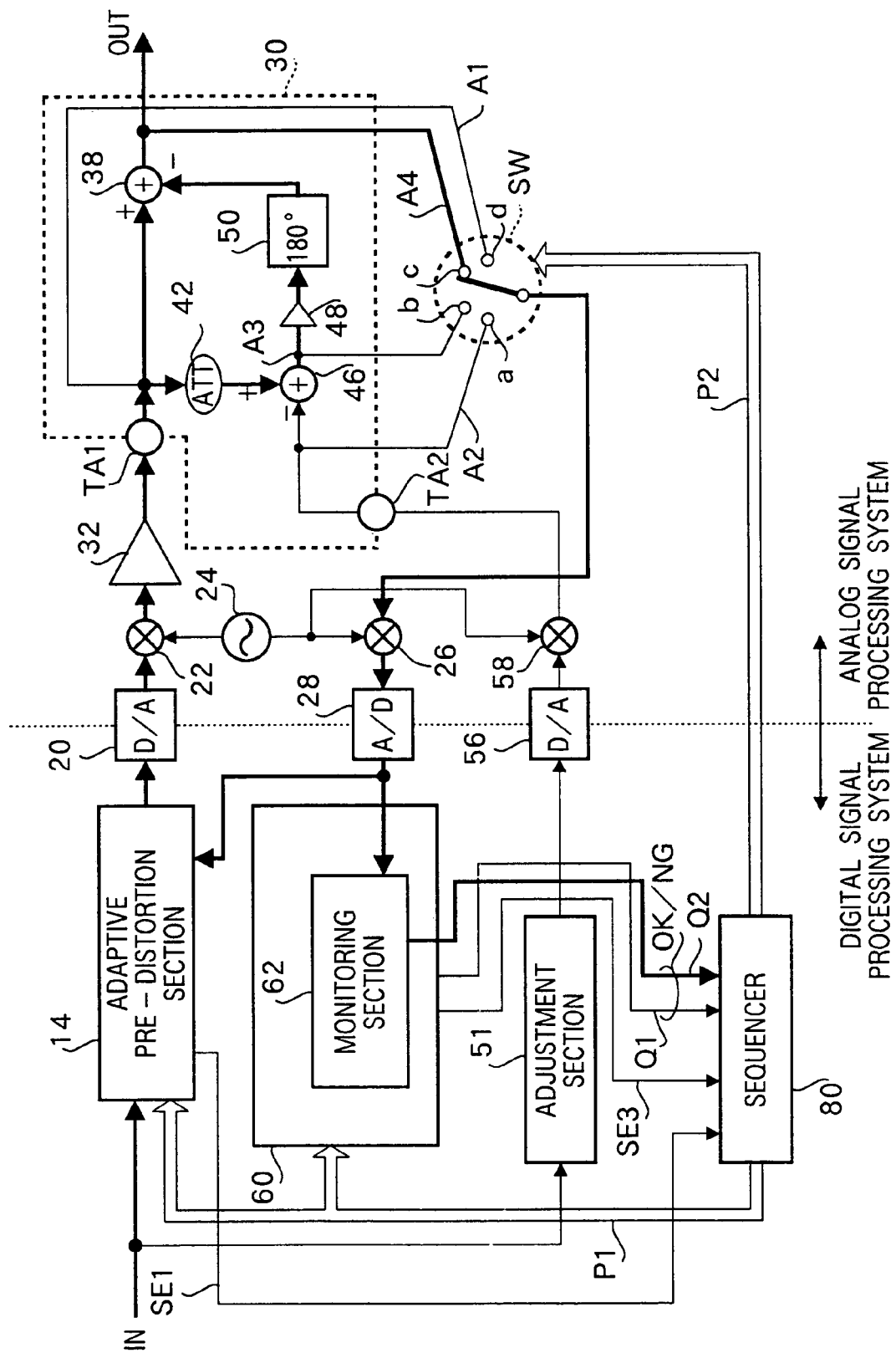
FIG. 5 is a view for explaining characteristic operation (signal current) of the distortion compensation circuit of FIG. 1 in a monitoring stage.

FIG. 5 is a view for explaining a monitoring stage (final stage in the distortion compensation processing).

In this stage, the switch circuit (SW) is switched to the c-port side by the control signal (P2) from the sequencer 80.

Furthermore, the sequencer 80 gives the adaptive pre-distortion section 14 and the control-monitoring section 60 the signal indicating the state of the switch circuit (SW) (the switch state signal P1).

The control-monitoring section 60 recognizes that the current stage is a stage of monitoring the suppression state of distortion contained in the output signal of the feed forward distortion compensation circuit 30 (whether the distribution of distortion obtained by frequency spectrum analysis is within a permissible range), from the switch circuit (SW) being switched to the c-port side.

In the present stage, the final output signal (A4) of the distortion compensation circuit of the present embodiment is selectively taken out from the switch circuit SW and fed back to the digital signal processing system.

A monitoring section 62 of the control-monitoring section 60 obtains frequency spectrum information of the feedback signal and monitors whether the frequency spectrum of the feedback signal is suppressed to within a predetermined emission mask by comparing it with the predetermined emission mask.

The control-monitoring section 60 regularly monitors, and each time one repetition of the monitoring finishes, sends a signal Q2 indicating the monitoring result (OK/NG) to the sequencer 80.

As long as the signal Q2 from the control-monitoring section 60 indicates OK, the sequencer 80 continues the monitoring.

In a state where the monitoring continues, adaptive control of the pre-distortion distortion compensation is suspended. Power consumption is reduced by an amount corresponding to the fact that the circuits for the adaptive control is not operating.

On the other hand, when the signal Q2 from the control-monitoring section 60 indicates NG, the sequencer 80 makes the adaptive pre-distortion stage shown in FIG. 2 performed again, and then the stages of FIG'S. 3, 4 sequentially executed.

Figure 7:
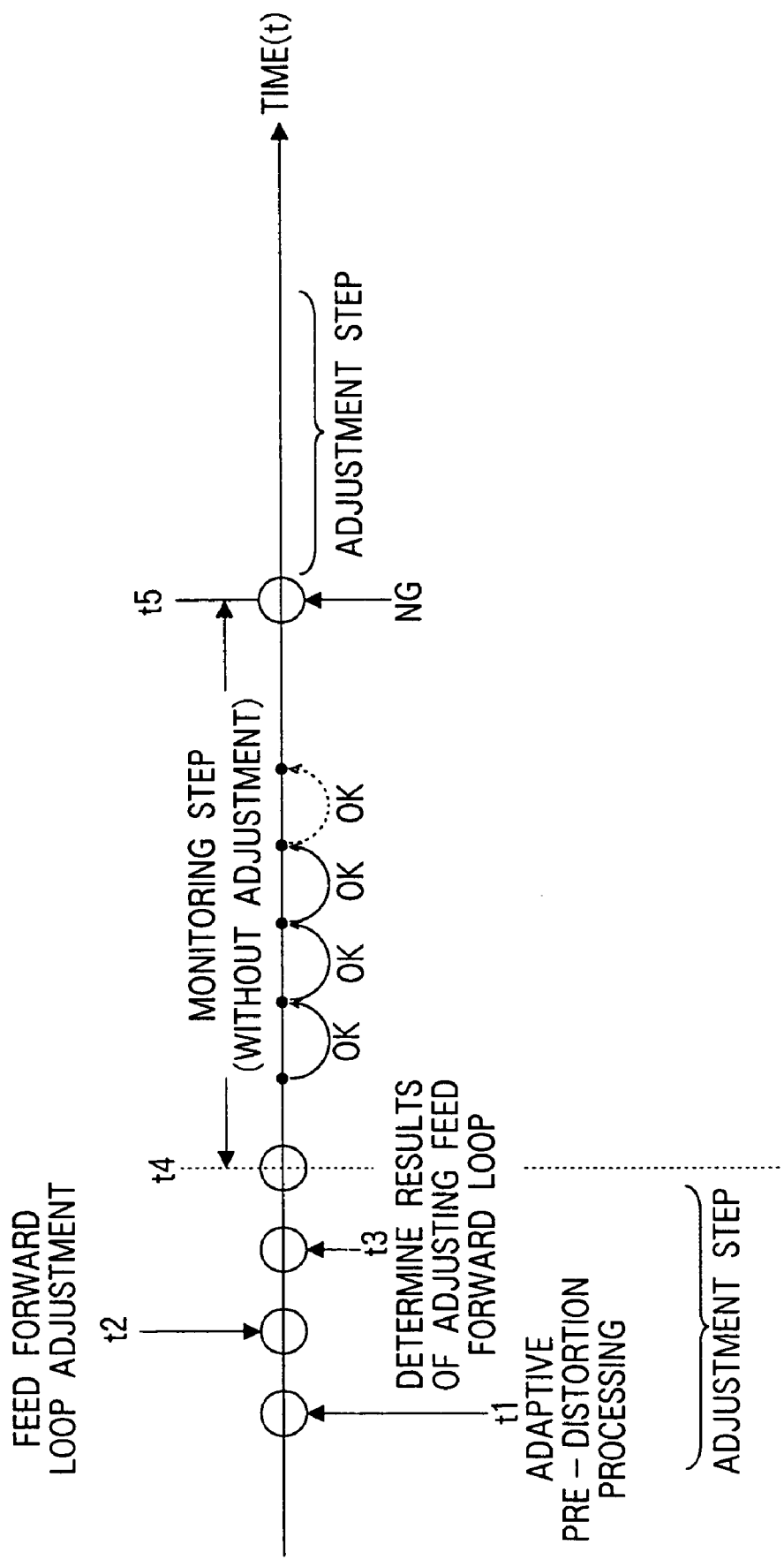
FIG. 7 is a view showing a major operation procedure in the hybrid distortion compensation method of the present invention against a time axis.

FIG. 7 shows the flow of the above stages in time series.

First, the adaptive pre-distortion processing is performed at time t1.

Next, the adjustment of the feed forward loop in the feed forward distortion compensation circuit (adjustment to match the characteristics of the reference signal with those of the main path signal) is performed at time t2, and the determination processing (measurement of the leakage amount of the reference signal) is performed on the adjustment results at time t3.

As a result of this determination, if the reference signal component is contained to a degree beyond a permissible value, the feed forward loop is adjusted over again.

Then after the completion of the feed forward loop adjustment, the monitoring step is taken from time t4. The monitoring step analyzes the frequency spectrum of the final output signal (transmit signal) of the distortion compensation circuit.

Next, the measured frequency spectrum is compared to a predetermined reference mask pattern (emission mask pattern) to check the suppression state of distortion against the frequency axis, and when the frequency spectrum is suppressed to within a permissible range, the monitoring continues as it is. During this time, a lookup table (LUT) for the pre-distortion processing is not updated adaptively.

At time t5, if determined to be NG as a result of the monitoring, a series of sequential steps (adjustment steps) from time t1 to time t4 is executed over again.

Figure 6:
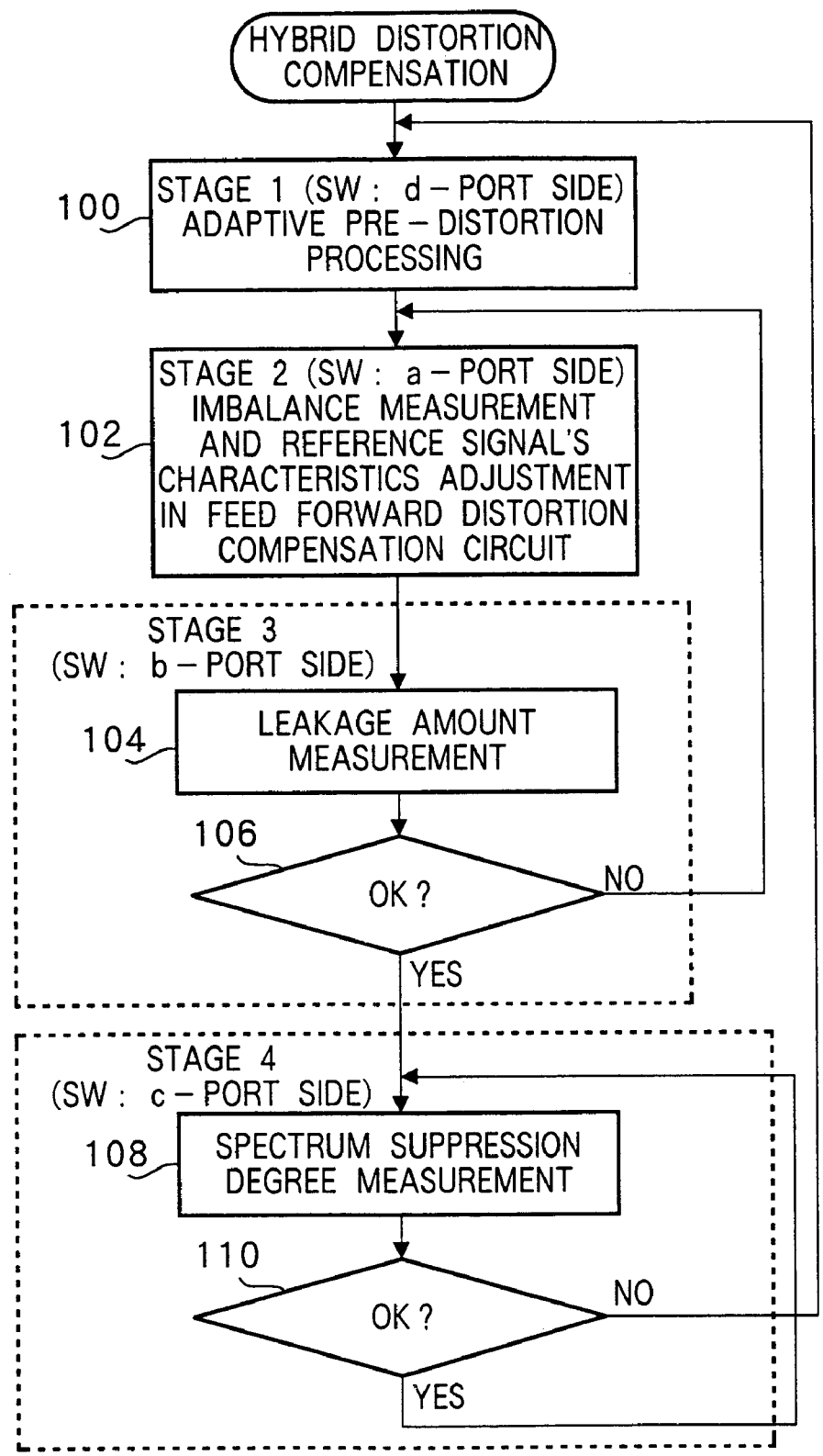
FIG. 6 is a flow chart showing a major procedure in a hybrid distortion compensation method of the present invention (a distortion compensation method using both pre-distortion distortion compensation and feed forward distortion compensation and controlling full-digitally)

FIG. 6 shows main processing states and main operations in the distortion compensation method (hybrid scheme distortion compensation method having the adaptive pre-distortion processing and the feed forward distortion compensation combined) of the present embodiment.

First, the switch circuit SW is switched to the d-port side, and the adaptive pre-distortion processing is performed (stage 1, step 100).

Next, the switch circuit SW is switched to the a-port side.

Then, imbalance in gain (amplitude), delay, and phase between the two input signals (the input signal to the main path and the reference signal) of the feed forward distortion compensation circuit 30 is measured, and the characteristics of the reference signal are adjusted so as to resolve the imbalance (stage 2, step 102).

Next, the switch circuit SW is switched to the b-port side, and thus the stage 3 is taken, which checks the adjusting results of the stage 2.

In this stage 3, the power value of the reference signal component (the leakage amount of the reference signal) except for the distortion signal in the feed forward loop is measured (step 104).

Then it is determined whether the leakage amount is above a threshold value (step 106), and, upon NG, the process returns to the stage 2, and upon OK, proceeds to a stage 4.

In this stage 4, the switch circuit SW is switched to the c-port side, and then the frequency spectrum of the final output signal of the distortion compensation circuit is measured (step 108) and compared to a predetermined reference mask pattern (emission mask pattern) to determine the suppression state of distortion against the frequency axis (step 110).

As a result of the determining, if the frequency spectrum is suppressed within a predetermined range, the monitoring is continued, and otherwise the process returns to the stage 1 to sequentially execute the above processes (Embodiment 2)

An example of the more specific configuration of the distortion compensation circuit and characteristic circuit operation thereof will be described with reference to FIG'S. 8 to 10.

Figure 8A:
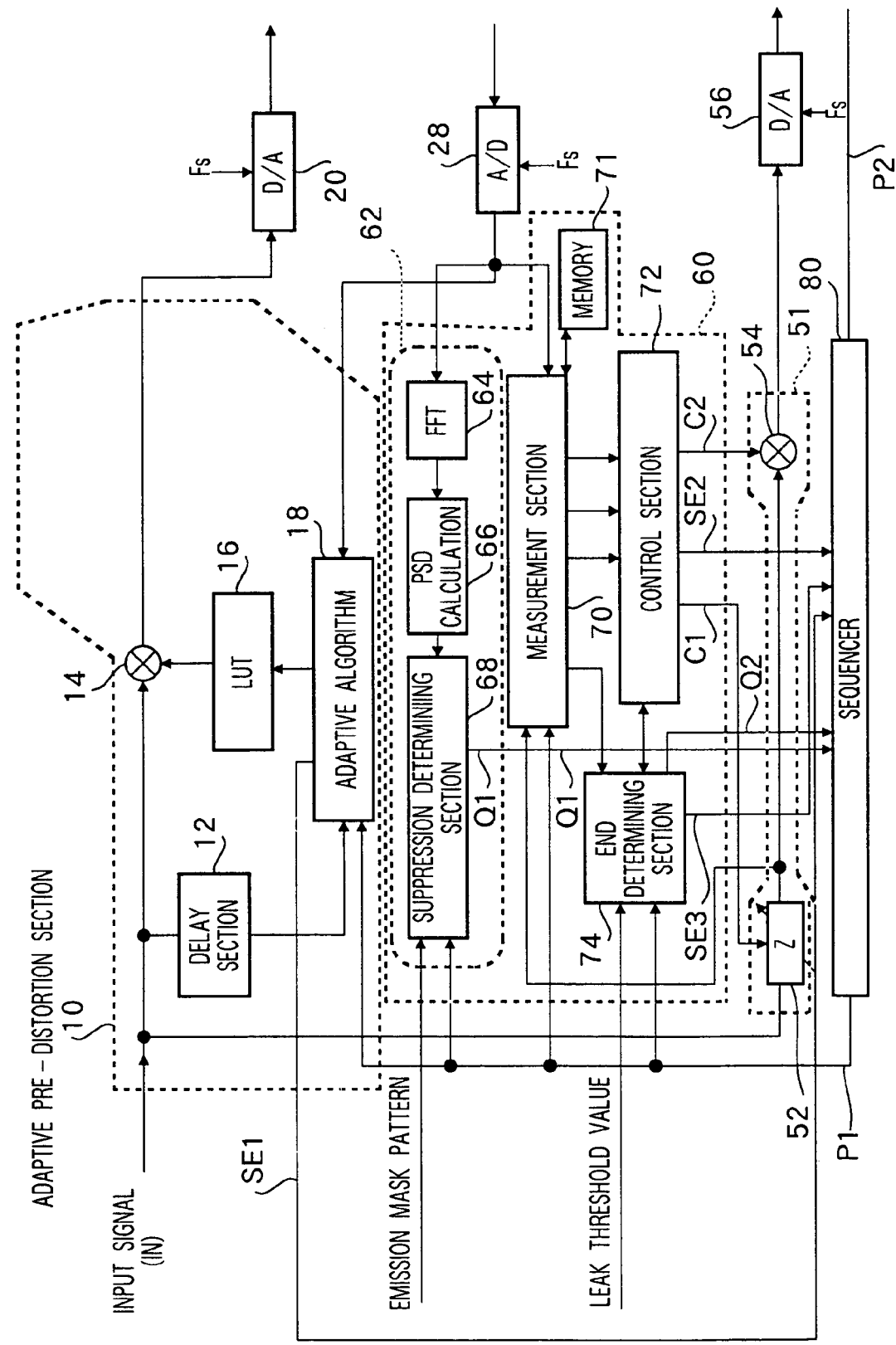
FIG. 8A is a circuit diagram showing the basic configuration of a distortion compensation circuit according to embodiment 2 of the present invention.
Figure 8B:
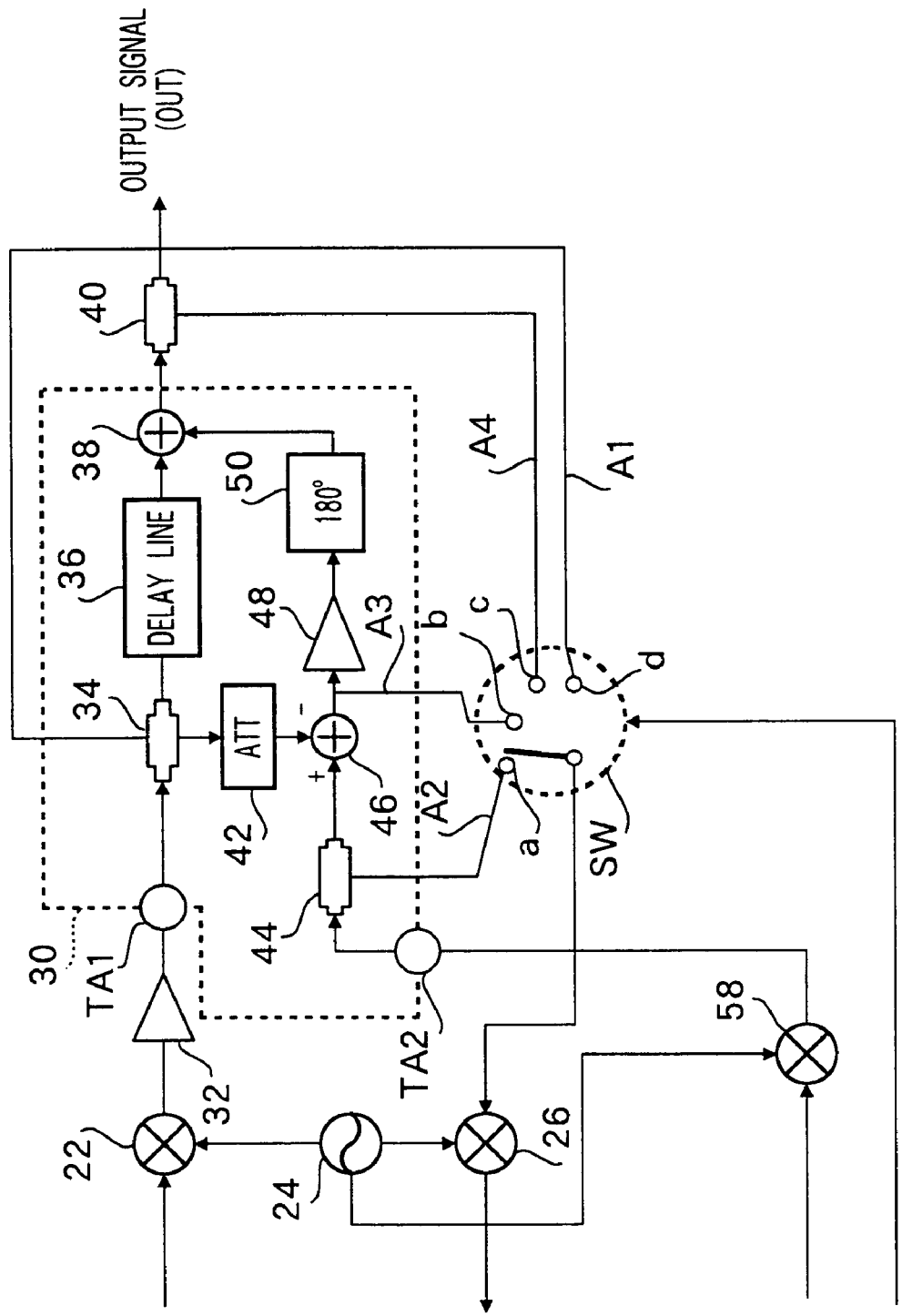
FIG. 8B is a continuation of FIG. 8A.

The basic configuration of the distortion compensation circuit shown in FIG. 8A and FIG. 8B is the same as the configuration of the distortion compensation circuit of FIG. 1. FIG. 8A and FIG. 8B show more fragmented function blocks instead of parts each illustrated as one function block in FIG. 1 and more specifically illustrates the circuit configurations of the components.

Note that in the circuit of FIG. 8A and FIG. 8B, the same parts as in FIG. 1 are indicated by the same reference codes.

The adaptive pre-distortion section 14 comprises an adaptive algorithm 18, a lookup table (LUT) 16 storing control data, a multiplier 13, and a delay section 12.

The adaptive algorithm 18 detects a residual distortion component by obtaining the difference between the feedback signal fed back from the analog signal processing system and a delayed signal obtained by the delay section 12 delaying the input signal (IN) by a time necessary for the feedback signal to return.

Then in order to reduce the residual distortion component, the lookup table (LUT) 16 is updated, and the multiplier 13 multiplies the input signal (IN) by control data output from the LUT 16 to perform the adaptive pre-distortion processing.

As a result, distortion having a characteristic opposite to the frequency characteristic of the high frequency power amplifier 32 is intentionally given to the input signal (IN).

Distortion due to the non-linear characteristic of the high frequency power amplifier 32 is compensated for to a great degree over a wide frequency band by the effect of the pre-distortion processing, but non-linearity in a high frequency domain cannot be compensated for.

The feed forward distortion compensation circuit 30 is provided to remove high order distortion, which cannot be removed by the pre-distortion processing. In the figure, the reference codes 34, 40, and 44 indicate wave splitters, and the reference code 36 indicates a delay line for timing adjustment.

By removing high order distortion by the feed forward distortion compensation, the linearity of the output signal (OUT) is ensured over a very wide band.

The control-monitoring section 60 has as a controlling block a measuring section 70, a control section 72 controlling the adjustment section 51 to adjust the gain, phase, and delay of the input signal (IN), and an end determination section 74 determining the adjustment result of the adjustment section 51.

The end determination section 74 determines whether the amount of the leak component of the reference signal appearing in the feed forward loop is above a leak threshold value.

Furthermore, the control-monitoring section 60 has a monitoring section 62 as a block in charge of monitoring, and the monitoring section 62 has an FFT analyzer 64, a PSD calculation section calculating a power spectrum density (PSD), and a suppression determining section 68.

The suppression determining section 68 determines whether the distribution of the power spectrum density is suppressed within various emission mask patterns defined by, for example, the W-CDMA communications standard.

The adjustment section 51, which adjusts the amplitude, phase, and delay of the input signal (IN), has a variable delay circuit 52 and a circuit 54 that adjusts the phase and amplitude of the input signal (IN) by multiplying by a coefficient.

The characteristics of the variable delay circuit 52 and the phase-amplitude adjustment circuit 54 are controlled respectively by control signals C1, C2 output from the control section 72.

The sequencer 80 has the stage end signals SE1 to SE3 each indicating the end of one processing stage and the signals Q1, Q2 indicating the determining result (OK/NG) input therein.

The sequencer 80, based on these input signals, recognizes what processing to perform next, and sends a switch control signal P2 to the switch circuit (SW) to control the switching. Furthermore, the sequencer 80 sends a switch state information P1 to each part to notify the current switch state of the switch circuit (SW). By this means each part learns the current processing stage.

Figure 9:
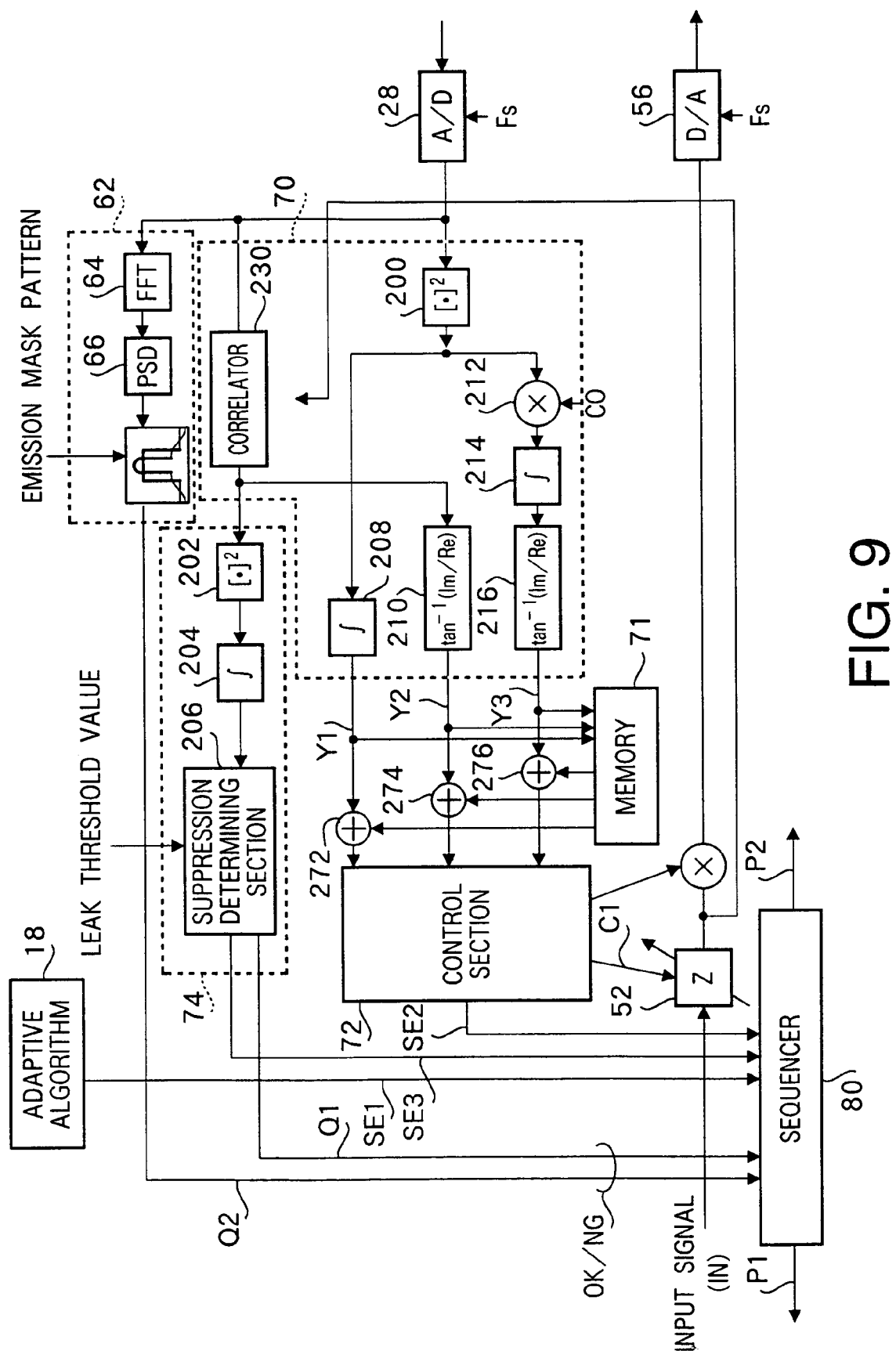
FIG. 9 is a block diagram showing an example of the specific configuration of a gain phase delay imbalance measuring section in the circuit of FIG. 8A and FIG. 8B.

FIG. 9 shows an example of the specific internal configuration of the measurement section 70.

The gain (amplitude) of the feedback signal is obtained by calculating the square of the converted output signal (feedback signal) of the A/D converter 28 by a square calculating section 200 and then integrating the square by an integrator 208. In FIG. 9, the obtained gain is indicated by a reference code Y1.

The obtained gain (of the main path signal of the feed forward distortion compensation circuit 30) Y1 is temporarily stored in the memory 71.

Then in the next processing stage, at the time when the gain of the reference signal is obtained, an adder 272 performs subtraction to obtain the difference between the previously obtained gain and the gain obtained this time (gain difference).

The phase of the feedback signal is obtained as information about a relative phase difference with the input signal IN (the reference signal).

That is, a correlator 230 obtains a complex correlation between the input signal IN (the reference signal) and the feedback signal, and a calculation section 210 calculates the arctangent of the ratio of orthogonal and in-phase components of the correlation value to obtain the phase Y2.

The obtained phase (of the main path signal of the feed forward distortion compensation circuit 30) Y2 is temporarily stored in the memory 71.

Then in the next processing stage, at the time when the gain of the reference signal is obtained, an adder 274 performs subtraction to obtain the difference between the previously obtained phase and the phase obtained this time (phase difference).

Moreover, the delay of the feedback signal can be measured using a characteristic property of the transmit signal in the CDMA scheme. For example, in the digital modulated signal of mobile communications of the W-CDMA scheme, a sine wave component having symbol (chip) timing information existing near close a frequency of half of a symbol rate (chip rate).

Accordingly, the delay is obtained in the following manner: the square calculating section 200 obtains the square of the feedback signal, the detector 212 extracts the sine wave component by performing super heterodyne detection on the square value, an integrator 214 integrates it, and a calculation section 216 calculates the arctangent of the ratio of orthogonal and in-phase components and obtains the delay.

The obtained delay (of the main path signal of the feed forward distortion compensation circuit 30) Y3 is temporarily stored in the memory 71.

Then in the next processing stage, at the time when the gain of the reference signal is obtained, an adder 276 performs subtraction to obtain the difference between the previously obtained delay and the delay obtained this time (delay difference).

Furthermore, in a stage that determines the results of adjusting the characteristics of the reference signal, the leakage amount of the reference signal component contained in the feedback signal is measured in the following manner: a square calculation section 202 obtains the square of a correlation value obtained by a correlator 230, and an integrator 204 integrates it.

Then a suppression determining section 206 determines whether the obtained leakage amount is above a leakage threshold value.

Figure 10:
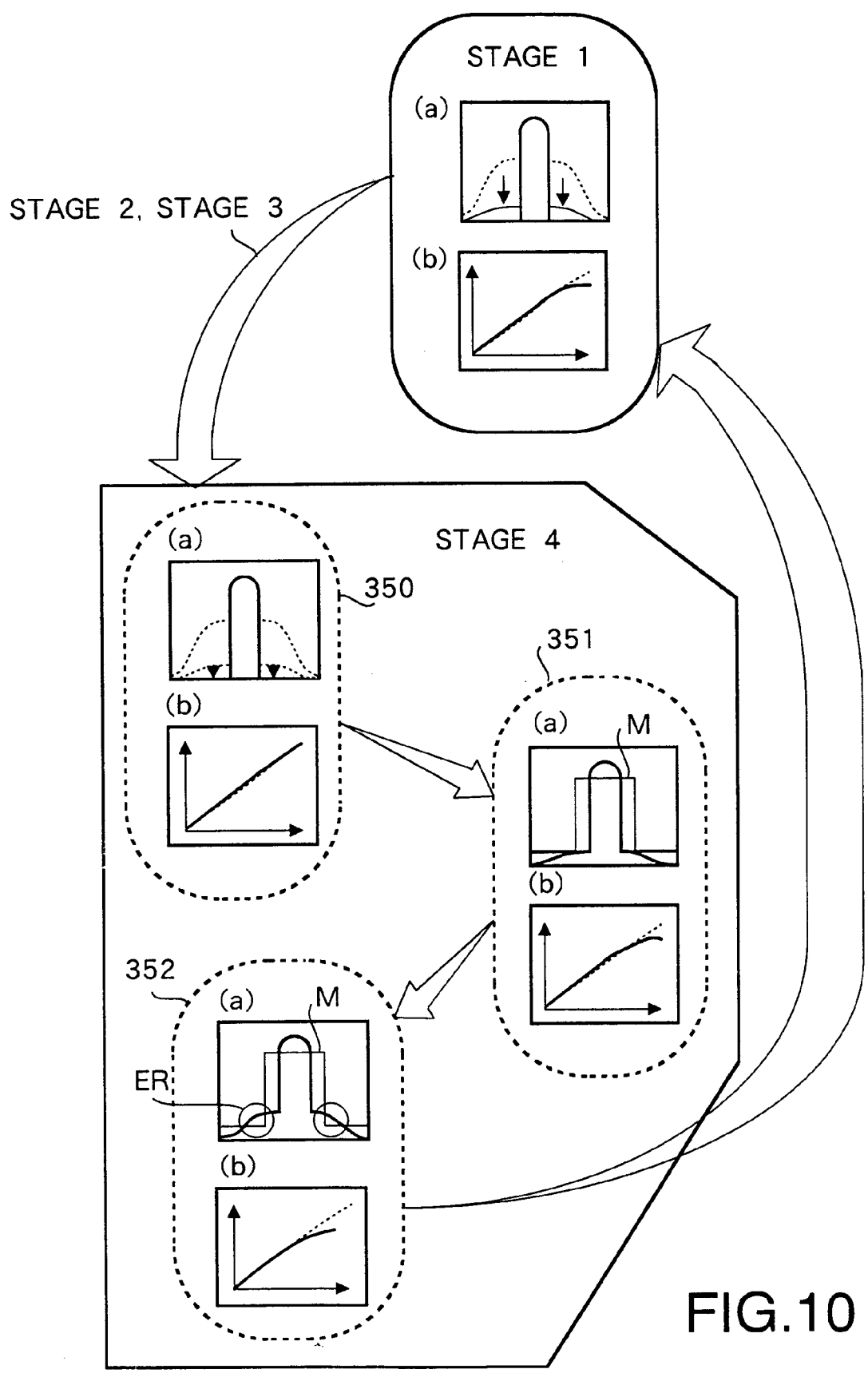
FIG. 10 is a view showing the frequency characteristic and the frequency spectrum of a final output signal (OUT) in a state 1 (stage 1) and a state 4 (stage 4) of the circuit of FIG. 8A and FIG. 8B.

FIG. 10 shows the frequency characteristic (indicated by (a) in the figure) and the frequency spectrum (indicated by (b) in the figure) of the final output signal (OUT) in the stages 1 and 4.

In the stage 1 (the adaptive pre-distortion processing stage), high order distortion cannot be completely removed.

However, as the process proceeds to the stages 2, 3 to the stage 4 (monitoring stage) in which distortion compensation in combination with the feed forward distortion compensation is performed, and distortion can be almost completely removed over a wideband as shown in a monitoring state 350.

A monitoring state 351 shows the case where the result of the frequency spectrum suppression determination using the emission mask (M) is good.

And when part of the frequency spectrum sticks out of the emission mask (M) as shown in a monitoring state 352 (the sticking part being indicated by a reference code ER) and thus the result of the frequency spectrum suppression determination is NG, the process returns to the stage 1, and the processes of the stages are sequentially executed over again.

(Embodiment 3)

Figure 11:
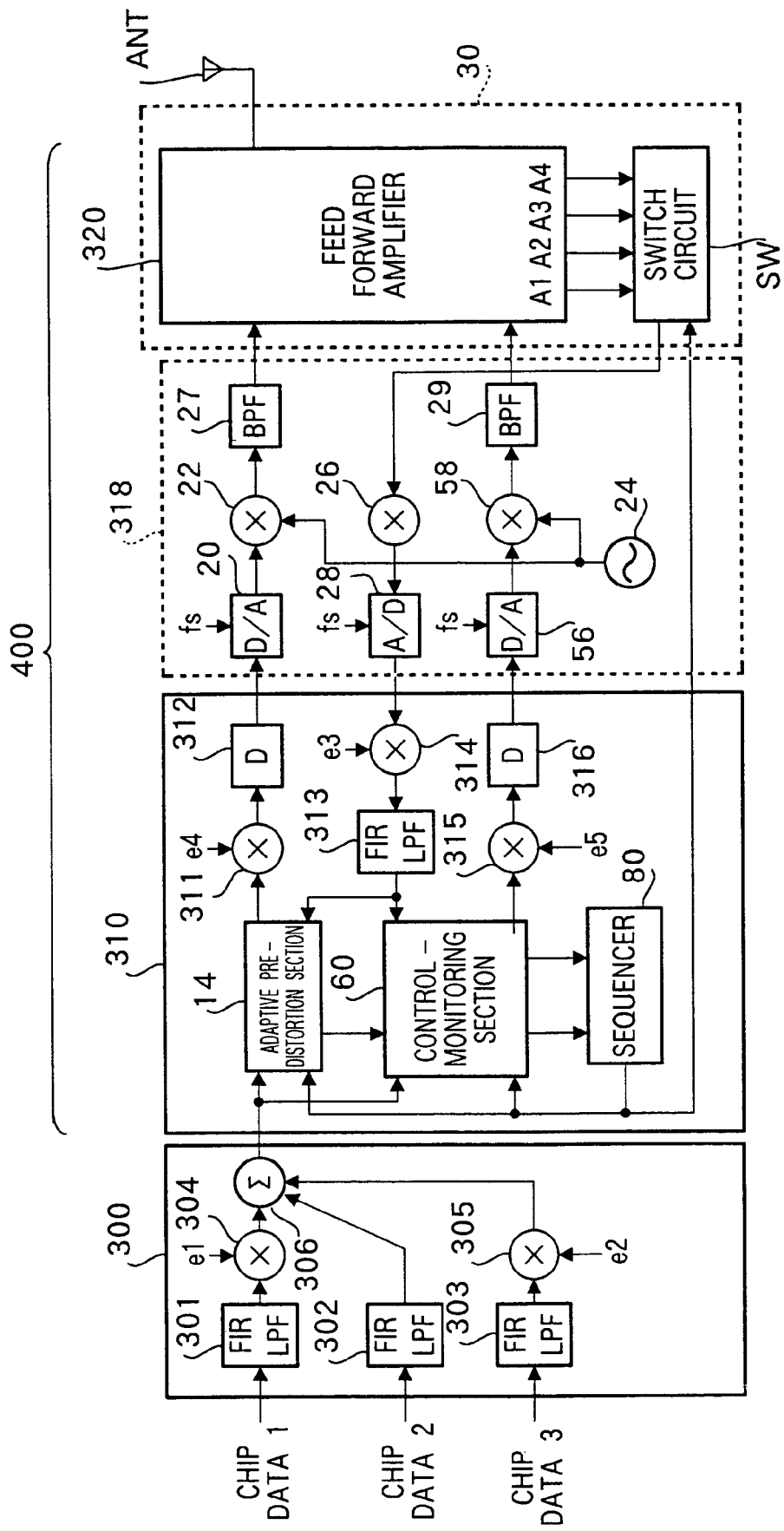
FIG. 11 is a block diagram showing an example of the configuration of a multicarrier transmit apparatus of a W-CDMA scheme that comprises the distortion compensation apparatus of the present invention.

FIG. 11 is a block diagram showing the configuration of a multicarrier transmit apparatus of the W-CDMA scheme that comprises the distortion compensation apparatus of the present invention. In FIG. 11, the same parts as in the previous figures are indicated by the same reference codes for ease of description.

As illustrated, the multicarrier transmit apparatus comprises a multicarrier baseband processor 300 and a distortion compensation apparatus 400 of the present invention.

The multicarrier baseband processor 300 comprises FIR low pass filters 301 to 303 and coefficient multipliers 304, 305, and a compositor 306.

The distortion compensation apparatus 400 comprises a digital signal processing system 310, a digital/analog interface system 318, a feed forward distortion compensation apparatus 30 of the present invention (including a feed forward amplifier 320 and a switch circuit SW as components).

The digital signal processing system 310 comprises an adaptive pre-distortion section 14, a control-monitoring section 60, a sequencer 80, frequency converters 311, 314, 315, delay sections 312, 316, and an FIR low pass filter 313.

The digital/analog interface system 318 comprises D/A converters 20, 56, an A/D converter 28, frequency converters (22, 26, 58, 24), and band pass filters (BPFs) 27, 29.

FIG'S. 12A to 12D indicates frequency spectrums of an input signal (the number of carriers being three), a pre-distortion signal, and a reference signal and output signal in feed forward distortion compensation.

As is clear from these figures, according to the present invention, highly accurate distortion compensation can be performed over a wideband.

In recent multicarrier communications of the W-CDMA scheme, higher linearity is required of high frequency power amplifiers compared to mobile communications of other schemes. Hence, without compensating for the linearity deviation of the power amplifiers by using distortion compensation technology such as adaptive pre-distortion, power efficiency severely deteriorates.

An input signal to the power amplifier has a bandwidth of 15 to 20 MHz. Hence, the band of a distortion component spreads from 100 to 200 MHz.

To compensate for this distortion component through adaptive pre-distortion alone, a digital signal having pre-distortion processing performed thereon needs to be D/A-converted at a sampling frequency of about 100 to 200 MHz, which is at least the same as the band of the distortion component.

Furthermore, to perform adaptive pre-distortion processing, an output signal of the power amplifier needs to be fed back to the digital signal processing system, and thus needs to be D/A-converted at a sampling frequency of about 100 to 200 MHz, which is at least the same as the band of the distortion component, likewise.

Moreover, according to the standard of the W-CDMA scheme, a resolution of as many as 12 to 16 bits is required of D/A and A/D converters.

Given the present semiconductor technology, it is very difficult to produce D/A and A/D converters that can operate at 100 to 200 MHz while securing the high resolution of 12 to 16 bits.

Furthermore, even if such D/A and A/D converters could be produced, the amount of power consumption during the operation would be enormous, which contradicts with the distortion compensation for improving power efficiency.

Therefore, in the present embodiment, the band of a signal to have adaptive pre-distortion processing performed thereon is limited to frequency at which the D/A converters 20, 56 and the A/D converter 28 can achieve resolutions of 12 to 16 bits.

And high order distortion occurring in a higher frequency band than that is removed by the feed forward distortion compensation circuit 30 having its characteristics adjusted by digital signal processing.

Thus, according to the present invention, extremely highly accurate distortion compensation, which has been impossible before, is possible using the existing LSI technology.

As described above, according to the present invention, while satisfying the demand for smaller and simplified circuits with reduced power consumption and lowered cost using the existing LSI technology, the capability of distortion compensation circuits to compensate for wideband, non-linear distortion can be naturally and greatly improved.

The band of an emission mask of category A/B defined in 3GPP TS 25.104 that is the W-CDMA standard is a very wide band that covers up to about 1 GHz above and below the signal band as the center. It has been impossible to remove high order distortion components occurring in this wideband by a usual adaptive pre-distortion circuit, but the use of the present invention can meet even such strict requirements.

The present description is based on Japanese Patent Application No. 2002-139111 filed on May 14, 2002, which is herein incorporated by reference.

INDUSTRIAL APPLICABILITY

The present invention can be applied to a hybrid distortion compensation method and apparatus using both distortion compensation of a scheme that performs pre-distortion processing on a digital signal and distortion compensation of a feed forward scheme.

What is claimed is:

1. A hybrid distortion compensation method of digital control using both pre-distortion processing of a digital signal and distortion canceling processing of a feed forward scheme, said method comprising:

a first step of performing pre-distortion processing on an input digital signal by a pre-distortion circuit, converting the pre-distortion processed digital signal into an analog signal, amplifying the converted analog signal by a power amplifier, converting the amplified signal into a digital signal, and adaptively controlling a pre-distortion characteristic of said pre-distortion circuit based on the converted digital signal;

a second step of converting each of the output signal of said power amplifier input to a main path of a circuit that performs said distortion canceling processing of the feed forward scheme and a reference signal input to a feed forward loop into a digital signal, measuring characteristics of each converted signal by using digital signal processing, and adjusting at least one of gain, phase, and delay of said reference signal based on the measuring results such that the characteristics of said converted signals are the same;

a third step of converting a signal of said feed forward loop in said circuit that performs the distortion canceling processing of the feed forward scheme into a digital signal, detecting a correlation between the digital signal and said reference signal to measure a leakage amount of the reference signal contained in said signal of the feed forward loop, and determining the adjusting result of the second step; and a fourth step of converting the output signal of said circuit that performs the distortion canceling processing of the feed forward scheme into a digital signal, and monitoring whether a predetermined characteristic of the converted digital signal is within a permissible range by using digital signal processing.

2. The hybrid distortion compensation method according to claim 1, wherein in the second step, the measuring of the characteristics of each converted signal using digital signal processing includes at least one of:
  detecting a cross-correlation between each said converted signal and said reference signal, measuring an average of amplitudes of the detected cross-correlation values, and obtaining phase information of each said converted signal by using the measuring result; and
  obtaining a square value of each said converted signal, and obtaining gain and delay information of each said signal based on the obtained square value.

3. The hybrid distortion compensation method according to claim 1, wherein said monitoring in the fourth step includes measuring a frequency spectrum of said converted digital signal and determining whether the frequency spectrum is suppressed within a predetermined emission mask.

4. The hybrid distortion compensation method according to claim 1, wherein said monitoring in the fourth step includes discrete Fourier transforming said converted digital signal, calculating a power spectrum density function from the discrete Fourier transforming result, and comparing the calculated power spectrum density function with a predetermined envelope threshold value and determining whether the distortion compensation is good or poor.

5. The hybrid distortion compensation method according to claim 1, wherein, during said monitoring in the fourth step, the operation of adaptively controlling the pre-distortion characteristic in the first step and the operation of adjusting at least one of gain, phase, and delay of said reference signal in the second step are suspended.

6. The hybrid distortion compensation method according to claim 1, wherein the adaptive controlling of the pre-distortion characteristic of said pre-distortion circuit in the first step updates output data of a lookup table contained in said pre-distortion circuit.

7. The hybrid distortion compensation method according to claim 1, wherein when it is determined that said adjustment in the second step is not accurately performed, the adjustment of said reference signal is continued until it is determined that desired adjustment is achieved.

8. The hybrid distortion compensation method according to claim 1, wherein the determining of the adjusting result of the second step in the third step is performed by obtaining a cross-correlation between the digital signal into which said signal of the feed forward loop is converted and said reference signal, calculating power of said cross-correlation value, and comparing the calculated power value with a threshold value.

9. The hybrid distortion compensation method according to claim 1, wherein as a result of the monitoring in the fourth step, when it is determined that said predetermined characteristic of the converted digital signal is not within said permissible range, first through third steps are sequentially performed again.

10. A hybrid distortion compensation apparatus of a digital control scheme, comprising:
  a high frequency power amplifier;
  a pre-distortion section that gives a characteristic opposite to a non-linear characteristic of the high frequency power amplifier, to an input digital signal;
  a first signal path that comprises a first D/A converter for transmitting an output signal of the pre-distortion section to the high frequency power amplifier;
  a feed forward distortion compensation circuit that performs feed forward distortion compensation on the output signal of the high frequency power amplifier;
  an adjuster that adjusts a characteristic of the input digital signal not going through the pre-distortion section;
  a second signal path that comprises a second D/A converter for transmitting an output signal of the adjuster as a reference signal of feed forward distortion compensation to the feed forward distortion compensation circuit;
  a switch circuit that selectively takes out one of the output signal of the high frequency power amplifier given to the feed forward distortion compensation circuit, the reference signal given to the feed forward distortion compensation circuit via the second signal path, the signal of feed forward loop of the feed forward distortion compensation circuit and the output signal of the feed forward distortion compensation circuit;
  a third signal path comprising an A/D converter for feeding back the signal outputted from the switch circuit to the pre-distortion section side;
  a control section that measures a characteristic of each of the output signal of the high frequency power amplifier and the reference signal, which are fed back via the third signal path, adjusts a characteristic of the input digital signal by adaptively changing a characteristic of the adjuster based on the measurement results so that characteristic of both the signals become, the same, and, after the adjustment is completed, outputs a signal indicating adjustment completion;
  a monitoring section that measures a characteristic of the output signal of the feed forward distortion compensation circuit fed back via the third signal path, determines whether the distortion compensation is good or not based on the measurement result, and outputs a signal indicating the determination result; and
  a sequencer that receives the signal indicating adjustment completion outputted from the control section and the signal indicating the determination result outputted from the monitoring section, switches the switch circuit based on the received signals, and gives a signal indicating a switching state of the switch circuit, as a signal for sequentially controlling operations of the control section and the monitoring section, to the control section and the monitoring section.

11. The hybrid distortion compensation apparatus according to claim 10, wherein:
  said pre-distortion section is an adaptive pre-distortion section that can adaptively change a pre-distortion characteristic;
  said adaptive pre-distortion section adaptively controls the pre-distortion characteristic based on the output signal of the high frequency power amplifier fed back via the third signal path, and transmits a signal indicating control completion to the sequencer; and
  said sequencer switches the switch circuit based on the signal indicating control completion, the signal indicating adjustment completion outputted from the control section and the signal indicating the determination result outputted from the monitoring section, and gives the signal indicating a switching state of the switch circuit, as a signal for sequentially controlling operations of the control section and the monitoring section, to the control section and the monitoring section.

* * * * *